(12) United States Patent
Wang et al.

(10) Patent No.: US 10,940,849 B1
(45) Date of Patent: Mar. 9, 2021

(54) REAL-TIME OPTIMIZATION CONTROL METHOD FOR ELECTRO-MECHANICAL TRANSMISSION SYSTEM

(71) Applicants: Beijing Institute of Technology, Beijing (CN); Baotou Sansi Technology Development Co., Ltd., Inner Mongolia (CN)

(72) Inventors: Weida Wang, Beijing (CN); Changle Xiang, Beijing (CN); Lijin Han, Beijing (CN); Hui Liu, Beijing (CN); Donghao Zhang, Beijing (CN); Chao Yang, Beijing (CN); Shaoping Lv, Beijing (CN)

(73) Assignees: BEIJING INSTITUTE OF TECHNOLOGY, Beijing (CN); BAOTOU SANSI TECHNOLOGY DEVELOPMENT CO., LTD., Inner Mongolia (CN)

( * ) Notice: Subject to any disclaimer, the term of this patent is extended or adjusted under 35 U.S.C. 154(b) by 0 days.

(21) Appl. No.: 16/896,461

(22) Filed: Jun. 9, 2020

(30) Foreign Application Priority Data

Sep. 3, 2019 (CN) .......................... 201910831498.9

(51) Int. Cl.
*B60W 10/08* (2006.01)
*H02J 7/00* (2006.01)

(52) U.S. Cl.
CPC .......... *B60W 10/08* (2013.01); *H02J 7/0048* (2020.01); *B60W 2756/00* (2020.02)

(58) Field of Classification Search
None
See application file for complete search history.

(56) References Cited

U.S. PATENT DOCUMENTS

| 9,689,250 | B2 * | 6/2017 | Badkoubeh | ............. E21B 3/035 |
| 2014/0081499 | A1 * | 3/2014 | Ito | .................... B60W 30/1882 701/22 |
| 2015/0197234 | A1 * | 7/2015 | Liang | .................... B60W 20/10 701/22 |

* cited by examiner

*Primary Examiner* — Justin Holmes
(74) *Attorney, Agent, or Firm* — Dorsey & Whitney LLP

(57) ABSTRACT

The present invention discloses a real-time optimization control method for an electro-mechanical transmission system, and relates to the field of electro-mechanical transmission technologies. The method includes the following steps: (S0) starting; (S1) state observation: a current operating state of each element of the electro-mechanical transmission system is obtained through state observation; (S2) dynamic prediction: a feasible operating range of each element of the electro-mechanical transmission system is obtained through dynamic prediction; (S3) optimal decision: an optimal control command of each element in the optimal decision is formulated and executed; (S4) feedback correction: feedback correction is performed on control amounts of a motor and an engine of the electro-mechanical transmission system by using state deviations; and (S5) determining whether feedback correction meets a requirement, and if feedback correction meets the requirement, ending the process, or if feedback correction does not meet the requirement, repeating (S1).

9 Claims, 3 Drawing Sheets

REAL-TIME OPTIMIZATION CONTROL METHOD FOR ELECTRO-MECHANICAL TRANSMISSION SYSTEM

TECHNICAL FIELD

The present invention relates to the field of electro-mechanical transmission technologies, and more specifically, to a real-time optimization control method for an electro-mechanical transmission system.

BACKGROUND

A running electro-mechanical transmission system possibly is in either of two states: a steady state or a dynamic state. When the system is in the steady state, dynamic torque is zero, that is, in the system, drag torque (torque of a motor) and load torque are balanced, and the system is run at a constant speed. When the drag torque or the load torque in the system changes, there is dynamic torque, the system is in the dynamic state, and a speed is changing. Then, the system needs to change from one steady running state into another steady running state, and this changing process is referred to as a transition process. In the transition process, a rotation speed, torque, and a current of the motor need to change based on a particular law, and all are functions of time. All of starting, braking, a speed change, a load change, and the like of the system cause the transition process. For an electro-mechanical transmission system, a power of an engine is far greater than a power of a power battery pack, and a driving power of an entire vehicle can be changed if an operating point of the engine is changed, to adjust a vehicle speed. Therefore, an opening signal of an accelerator pedal may be explained as a target power of the engine, and larger opening of the pedal indicates a larger target power of the engine.

Because an operating state of an electric device directly determines safety performance of the entire vehicle, a power requirement of the electric device needs to be met first. On such a basis, if opening of the accelerator pedal is relatively small, that is, expectation of power performance is not high, the power battery pack is allowed to work in an optimal state, or if opening of the accelerator pedal is relatively large, the power battery pack is allowed to be charged and discharged at a large power, to ensure power performance of the vehicle. In addition, to ensure a dynamic response characteristic of the electro-mechanical transmission system, when pedal opening of a driver changes greatly, that is, a difference between a target rotation speed and an actual rotation speed of the engine is relatively large, the power battery pack is also allowed to be charged and discharged within a capability range thereof, to achieve optimal states of the engine and two motors. However, before the electro-mechanical transmission system is optimized, a current operating state and a feasible operating range of each element need to be learned. In addition, both an error of a model and external interference may cause an actual state of each element to deviate from its target state. To ensure a control effect, a corresponding control amount further needs to be corrected based on a state deviation of each element. Therefore, how to control an electro-mechanical transmission system is a technical problem urgently needing to be resolved.

SUMMARY

In view of the foregoing technical problem, the present invention provides a real-time optimization control method for an electro-mechanical transmission system, to effectively ensure a control effect of the electro-mechanical transmission system, and correct a corresponding control amount based on a state deviation of each element, so that the electro-mechanical transmission system achieves good working efficiency and state stability.

To implement the foregoing objective, the present invention provides the following technical solution: a real-time optimization control method for an electro-mechanical transmission system, including the following steps:

(S0) starting;

(S1) state observation: a current operating state of each element of the electro-mechanical transmission system is obtained through state observation;

(S2) dynamic prediction: a feasible operating range of each element of the electro-mechanical transmission system is obtained through dynamic prediction;

(S3) optimal decision: an optimal control command of each element in the optimal decision is formulated and executed;

(S4) feedback correction: feedback correction is performed on control amounts of a motor and an engine of the electro-mechanical transmission system by using state deviations; and (S5) determining whether feedback correction meets a requirement, and if feedback correction meets the requirement, ending the process, or if feedback correction does not meet the requirement, repeating (S1)-(S5).

In a further technical solution of the present invention, S1 is specifically as follows: output torque of the electro-mechanical transmission system is calculated and observed by using a torque estimation method, and because a dynamic response time of the motor of the electro-mechanical transmission system is far less than a dynamic response time of the engine, it is considered that actual torque of the motor is equal to target torque thereof, and is represented by using the following formula:

$$T_{eact} = J_e \frac{d\omega_2}{dt} + \frac{e_2 T_A + e_2 T_B}{i_q \eta_q},$$

where $T_{eact}$ represents the actual torque, $J_e$ is an equivalent moment of inertia of an output end of the engine, in the unit of kg·m$^2$, $\omega_e$ is an angular velocity of the engine, in the unit of rad/s, $\eta_q$ is transmission efficiency, $i_q$ is a transmission ratio of the engine to an input end of a power coupling mechanism, $T_A$ and $T_B$ are input torque and output torque of the coupling mechanism, and $e_1$ and $e_2$ are torque coefficient matrices in two modes.

In a further technical solution of the present invention, acceleration of the engine is obtained by performing Kalman filtering on a rotation speed of the engine.

In a further technical solution of the present invention, the electro-mechanical transmission system obtains a bus voltage by using a sensor, and then calculates a current and a state of charge (SOC) by using a battery pack model of the electro-mechanical transmission system, where formulas for calculating the current and the SOC of the battery pack are as follows:

$$I(t) = \frac{V_{oc} - \sqrt{(V_{oc}^2) + 4P_b(t)R_b}}{7200 C_b R_b}; \text{ and}$$

$$SOC(t) = -\int_0^t I(t)dt + SOC_0,$$

where in the foregoing formulas, I(t) represents a current, and a discharge is positive, in the unit of A; $V_{oc}$ represents an open circuit voltage, in the unit of V; $R_b$ represents an internal resistance, in the unit of Ω; $C_b$ represents a capacity, in the unit of Ah; and $SOC_0$ represents an initial SOC of the battery pack.

In a further technical solution of the present invention, S2 is specifically as follows:

two different motors of the electro-mechanical transmission system work within their respective upper rotation speed limit, the engine of the electro-mechanical transmission system works in a particular rotation speed range, and the following formulas are met:

$$n_e = \frac{1}{a_1}n_A - \frac{a_2}{a_1}n_o; \text{ and}$$

$$n_e = \frac{1}{b_1}n_B - \frac{b_2}{b_1}n_o,$$

where in an EVT1 mode, $a_1 > 0$, and $b_1 = 0$; therefore, a rotation speed of the engine monotonically increases with a rotation speed of a motor A, and is uncorrelated with a rotation speed of a motor B, and the rotation speed range of the engine may be obtained based on an upper rotation speed limit and a lower rotation speed limit of the motor A, and is as follows:

$$\frac{1}{a_1}n_{Amin} - \frac{a_2}{a_1}n_o < n_e < \frac{1}{a_1}n_{Amax} - \frac{a_2}{a_1}n_o;$$

in an EVT2 mode, $a_1 < 0$, and $b_1 > 0$; therefore, the rotation speed of the engine monotonically decreases with the rotation speed of the motor A, and monotonically increases with the rotation speed of the motor B, and the rotation speed range of the engine may be obtained based on the upper rotation speed limits and lower rotation speed limits of the two motors, and is as follows:

$$n_{emin} = \max\left(\frac{1}{a_1}n_{Amax} - \frac{a_2}{a_1}n_o, \frac{1}{b_1}n_{Bmin} - \frac{b_2}{b_1}n_o\right); \text{ and}$$

$$n_{emax} = \min\left(\frac{1}{a_1}n_{Amin} - \frac{a_2}{a_1}n_o, \frac{1}{b_1}n_{Bmax} - \frac{b_2}{b_1}n_o\right);$$

a torque range of the engine not only depends on a current rotation speed, but also is correlated with a dynamic response characteristic thereof, the engine is approximate to a first-order system herein, and the torque range thereof is as follows:

$$T_{emax} = T_{eact} + [f_e(n_{eact}) - T_{eact}]e^{-\frac{\delta t}{T}}; \text{ and}$$

$$T_{emin} = T_{eact}\left(1 - e^{-\frac{\delta t}{T}}\right),$$

where in the formulas, $f_e$ represents an external characteristic interpolation function of the engine; $\delta St$ represents a time step of dynamic prediction; and T represents a time constant of the engine.

In a further technical solution of the present invention, the EVT1 mode is a state in which a brake of the electro-mechanical transmission system is engaged and a clutch is disengaged; and the EVT2 mode is a state in which the brake of the electro-mechanical transmission system is disengaged and the clutch is engaged.

In a further technical solution of the present invention, S3 is specifically as follows:

an optimal rotation speed and target torque of the electro-mechanical transmission system are determined based on opening of an accelerator pedal of the electro-mechanical transmission system and by using an optimal working curve of the engine of the electro-mechanical transmission system; then, load torque of the electro-mechanical transmission system is determined based on a speed adjustment time requirement of the engine of the electro-mechanical transmission system, to impose torque restriction on multi-target optimization of the electro-mechanical transmission system; finally, performance indexes of the system are classified into multiple layers based on a priority of an energy management policy of the electro-mechanical transmission system, and an analytic method is used at each layer to obtain optimal torque of the two motors, where speed adjustment needs to be performed on the engine of the electro-mechanical transmission system before mode switching of the electro-mechanical transmission system, to ensure that a speed difference of the clutch or the brake of the electro-mechanical transmission system is less than a threshold; in this case, a target rotation speed of the engine of the electro-mechanical transmission system is no longer determined by the opening of the accelerator pedal, but depends on a current vehicle speed of the electro-mechanical transmission system instead, and a mathematical expression of the target rotation speed of the engine is:

$$n_{ecom} = \frac{(1 + k_2 + k_3)i_q i_h}{0.377(1 + k_2)r_z}v,$$

where in the formula, $n_{ecom}$ represents a target rotation speed of the engine before mode switching of the electro-mechanical transmission system.

In a further technical solution of the present invention, in feedback correction in step (S4):

if a speed difference between a target rotation speed and an actual rotation speed of the engine of the electro-mechanical transmission system exceeds a threshold, a torque value of the electro-mechanical transmission system is corrected; when the speed difference of the engine of the electro-mechanical transmission system is within a range of ±50 rpm, the torque does not need to be corrected; and when the speed difference is greater than zero, driving torque is increased and load torque is decreased; or when the speed difference is less than zero, driving torque is decreased and load torque is increased.

In a further technical solution of the present invention, when feedback correction is performed on the driving torque and the load torque of the engine of the electro-mechanical transmission system, the following formulas are used:

$$T_{ecom}' = k_T T_{ecom}; \text{ and}$$

$$T_{ef}' = k_{Tf} T_{ef}, \text{ where}$$

in the formulas, $k_T$ represents a correction coefficient of the driving torque of the engine of the electro-mechanical transmission system, and $k_{Tf}$ represents a correction coefficient of the load torque of the engine of the electro-mechanical transmission system.

Positive and Beneficial Effects of Real-Time Optimization Control:

The present invention provides the real-time optimization control method for an electro-mechanical transmission system, including four parts: state observation, dynamic prediction, optimal decision, and feedback correction. First, the current operating state of each element is obtained through state observation; then, the feasible operating range of each element is obtained through dynamic prediction; furthermore, the optimal control command of each element is obtained through optimal decision; and finally, feedback correction is performed on the control amounts of the engine and the two motors by using the state deviations, to effectively ensure the control effect of the electro-mechanical transmission system and correct the corresponding control amount based on the state deviation of each element, so that the electro-mechanical transmission system achieves good working efficiency and state stability.

DETAILED DESCRIPTION

The following clearly and completely describes the technical solutions in the examples of the present invention with reference to the accompanying drawings in the examples of the present invention. Apparently, the described examples are merely a part rather than all of the examples of the present invention. All other examples obtained by a person of ordinary skill in the art based on the examples of the present invention without creative efforts shall fall within the protection scope of the present invention.

Figure 1:
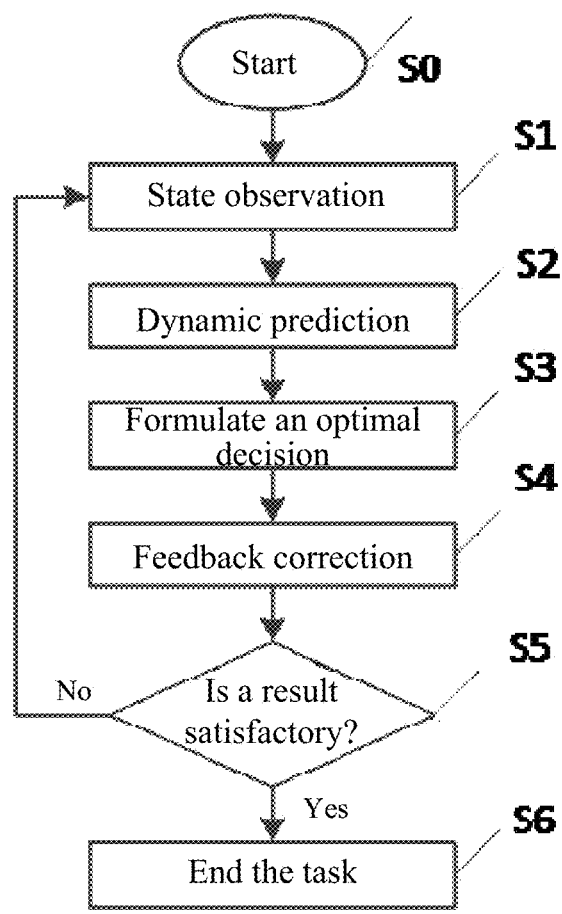
FIG. 1 is a schematic flowchart of a real-time optimization control method for an electro-mechanical transmission system according to the present invention.
Figure 2:
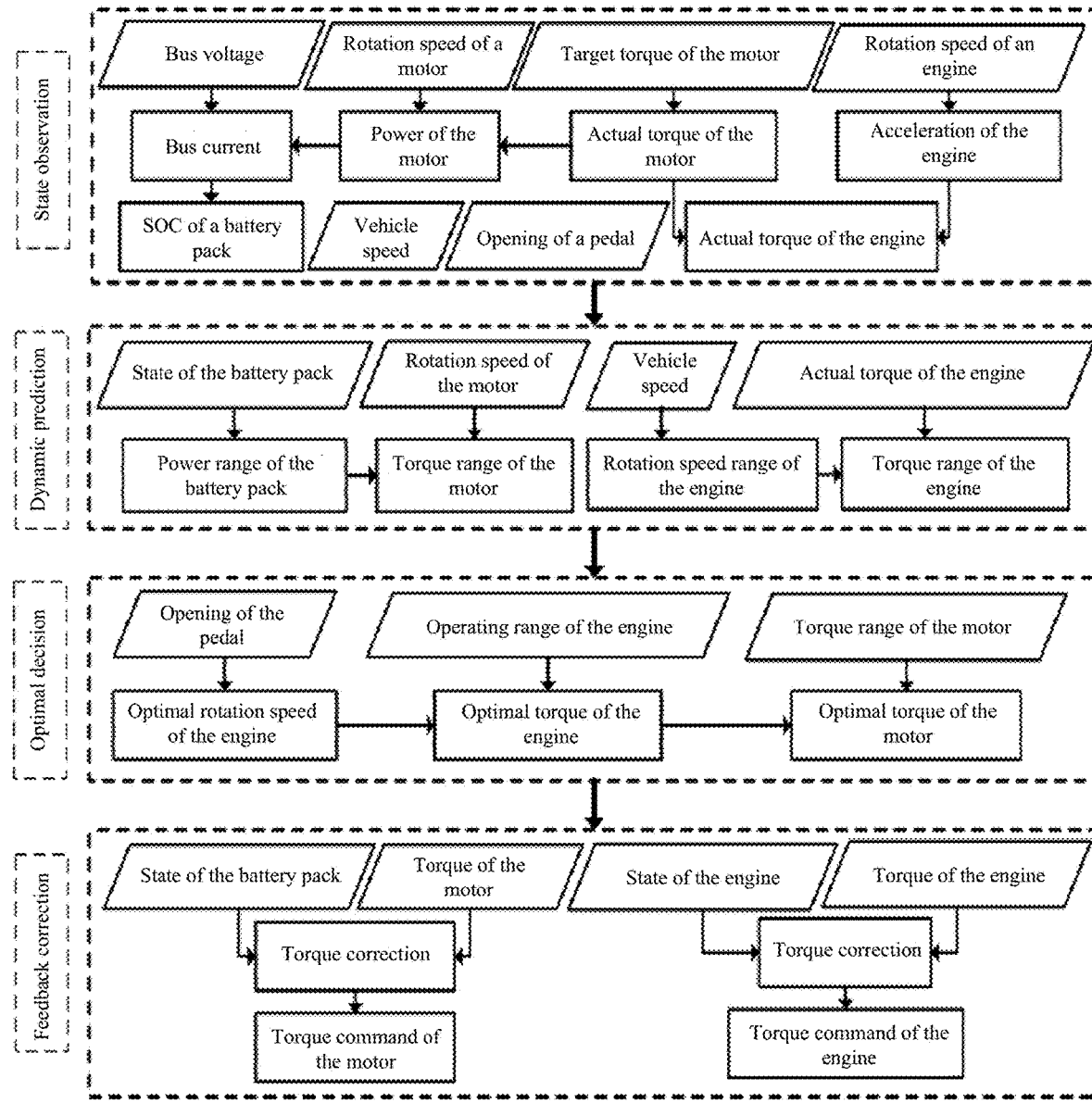
FIG. 2 is another schematic flowchart of a real-time optimization control method for an electro-mechanical transmission system according to the present invention.
Figure 3:
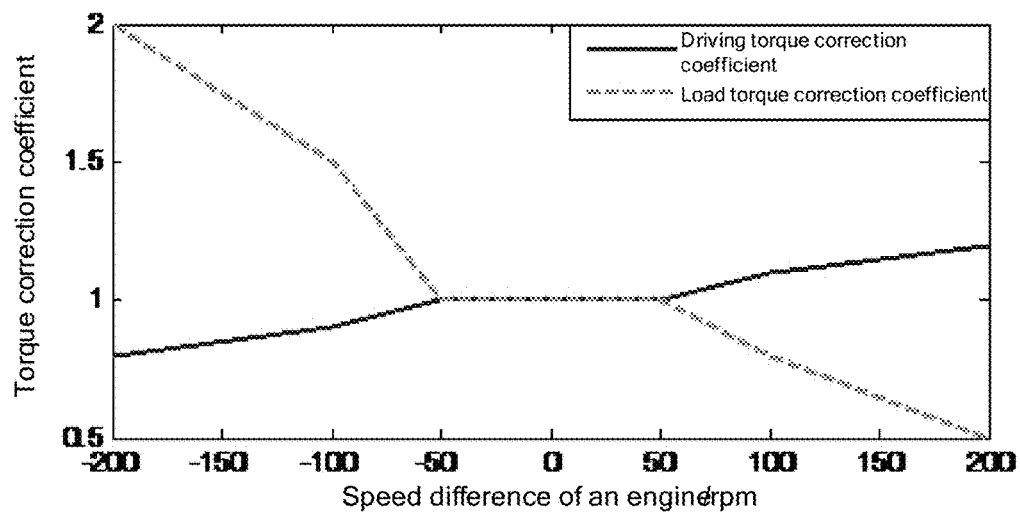
FIG. 3 is a schematic diagram of a torque correction coefficient in a real-time optimization control method for an electro-mechanical transmission system according to the present invention.

As shown in FIG. 1, a real-time optimization control method for an electro-mechanical transmission system is provided, and includes the following steps:

(S0) Start.

(S1) Perform state observation: a current operating state of each element of the electro-mechanical transmission system is obtained through state observation.

In this step, output torque of the electro-mechanical transmission system is calculated and observed by using a torque estimation method. Because a dynamic response time of a motor of the electro-mechanical transmission system is far less than a dynamic response time of an engine, it is considered that actual torque of the motor is equal to target torque thereof, and is represented by using the following formula:

$$T_{eact} = J_e \frac{d\omega_e}{dt} + \frac{e_1 T_A + e_2 T_B}{i_q \eta_q},$$

where $T_{eact}$ represents actual torque, $J_e$ is an equivalent moment of inertia of an output end of the engine, in the unit of kg·m², $\omega_e$ is an angular velocity of the engine, in the unit of rad/s, $\eta_q$ is transmission efficiency, $i_q$ is a transmission ratio of the engine to an input end of a power coupling mechanism, $T_A$ and $T_B$ are input torque and output torque of the coupling mechanism, and $e_1$ and $e_2$ are torque coefficient matrices in two modes.

In a specific embodiment, acceleration of the engine is obtained by performing Kalman filtering on a rotation speed of the engine.

In a specific embodiment, the electro-mechanical transmission system obtains a bus voltage by using a sensor, and then calculates a current and an SOC by using a battery pack model of the electro-mechanical transmission system, where formulas for calculating the current and the SOC of the battery pack are as follows:

$$I(t) = \frac{V_{oc} - \sqrt{V_{oc}^2 + 4P_b(t)R_b}}{7200 C_b R_b}; \text{ and}$$

$$SOC(t) = -\int_0^t I(t)dt + SOC_0,$$

where in the foregoing formulas, I(t) represents a current, and a discharge is positive, in the unit of A; $V_{oc}$ represents an open circuit voltage, in the unit of V; $R_b$ represents an internal resistance, in the unit of Ω; $C_b$ represents a capacity, in the unit of Ah; and $SOC_0$ represents an initial SOC of the battery pack.

(S2) Perform dynamic prediction: a feasible operating range of each element of the electro-mechanical transmission system is obtained through dynamic prediction.

In this step, a method for performing dynamic prediction is as follows:

Two different motors of the electro-mechanical transmission system work within their respective upper rotation speed limit, the engine of the electro-mechanical transmission system works in a particular rotation speed range, and the following formulas are met:

$$n_e = \frac{1}{a_1} n_A - \frac{a_2}{a_1} n_o; \text{ and}$$

$$n_e = \frac{1}{b_1} n_B - \frac{b_2}{b_1} n_o.$$

In an EVT1 mode, $a_1 > 0$, and $b_1 = 0$; therefore, the rotation speed of the engine monotonically increases with a rotation speed of a motor A, and is uncorrelated with a rotation speed of a motor B, and the rotation speed range of the engine may be obtained based on an upper rotation speed limit and a lower rotation speed limit of the motor A, and is as follows:

$$\frac{1}{a_1} n_{Amin} - \frac{a_2}{a_1} n_o < n_e < \frac{1}{a_1} n_{Amax} - \frac{a_2}{a_1} n_o.$$

In an EVT2 mode, $a_1 < 0$, and $b_1 > 0$; therefore, the rotation speed of the engine monotonically decreases with the rotation speed of the motor A, and monotonically increases with the rotation speed of the motor B, and the rotation speed range of the engine may be obtained based on the upper rotation speed limits and lower rotation speed limits of the two motors and is as follows:

$$n_{emin} = \max\left(\frac{1}{a_1}n_{Amax} - \frac{a_2}{a_1}n_o, \frac{1}{b_1}n_{Bmin} - \frac{b_2}{b_1}n_o\right); \text{ and}$$

$$n_{emax} = \min\left(\frac{1}{a_1}n_{Amin} - \frac{a_2}{a_1}n_o, \frac{1}{b_1}n_{Bmax} - \frac{b_2}{b_1}n_o\right).$$

A torque range of the engine not only depends on a current rotation speed, but also is correlated with a dynamic response characteristic thereof, the engine is approximate to a first-order system herein, and the torque range of the engine is as follows:

$$T_{emax} = T_{eact} + [f_e(n_{eact}) - T_{eact}]e^{-\frac{\delta t}{T}}; \text{ and}$$

$$T_{emin} = T_{eact}\left(1 - e^{-\frac{\delta t}{T}}\right),$$

where in the formulas, $f_e$ represents an external characteristic interpolation function of the engine; $\delta t$ represents a time step of dynamic prediction; and T represents a time constant of the engine.

In the present invention, the EVT1 mode is a state in which a brake of the electro-mechanical transmission system is engaged and a clutch is disengaged; and the EVT2 mode is a state in which the brake of the electro-mechanical transmission system is disengaged and the clutch is engaged. EVT1 and EVT2 represent that the power coupling mechanism have two operating modes.

A speed relationship between elements may be obtained based on a structural form of the power coupling mechanism:

$$\begin{bmatrix} \omega_A \\ \omega_B \end{bmatrix} = \begin{bmatrix} a_1 & a_2 \\ b_1 & b_2 \end{bmatrix}\begin{bmatrix} \omega_e \\ \omega_o \end{bmatrix},$$

in the formula: $\omega_A$, $\omega_B$, $\omega_e$ and $\omega_o$ respectively represent speeds of the motor A, the motor B, an engine, and an output shaft, and are in the unit of rad/s; and $a_1$, $a_2$, $b_1$, and $b_2$ are speed coefficients.

(S3) Formulate an optimal decision: an optimal control command of each element in the optimal decision is formulated and executed.

(S4) Perform feedback correction: feedback correction is performed on control amounts of the motor and the engine of the electro-mechanical transmission system by using state deviations.

(S5) Determine whether feedback correction meets a requirement, and if feedback correction meets the requirement, end the process, or if feedback correction does not meet the requirement, repeat steps (1)-(5).

In the present invention, S3 is specifically as follows:

An optimal rotation speed and target torque of the electro-mechanical transmission system are determined based on opening of an accelerator pedal of the electro-mechanical transmission system and by using an optimal working curve of the engine of the electro-mechanical transmission system; then, load torque of the electro-mechanical transmission system is determined based on a speed adjustment time requirement of the engine of the electro-mechanical transmission system, to impose torque restriction on multi-target optimization of the electro-mechanical transmission system; finally, performance indexes of the system are classified into multiple layers based on a priority of an energy management policy of the electro-mechanical transmission system, and an analytic method is used at each layer to obtain optimal torque of the two motors, where speed adjustment needs to be performed on the engine of the electro-mechanical transmission system before mode switching of the electro-mechanical transmission system, to ensure that a speed difference of the clutch or the brake of the electro-mechanical transmission system is less than a threshold; in this case, a target rotation speed of the engine of the electro-mechanical transmission system is no longer determined by the opening of the accelerator pedal, but depends on a current vehicle speed of the electro-mechanical transmission system instead, and a mathematical expression of the target rotation speed of the engine is:

$$n_{ecom} = \frac{(1 + k_2 + k_3)i_q i_h}{0.377(1 + k_2)r_z}v,$$

in the formula, $n_{ecom}$ represents a target rotation speed of the engine before mode switching of the electro-mechanical transmission system.

In the present invention, in feedback correction in step (S4):

if a speed difference between a target rotation speed and an actual rotation speed of the engine of the electro-mechanical transmission system exceeds a threshold, a torque value of the electro-mechanical transmission system is corrected; when the speed difference of the engine of the electro-mechanical transmission system is within a range of ±50 rpm, the torque does not need to be corrected; and when the speed difference is greater than zero, driving torque is increased and load torque is decreased; or when the speed difference is less than zero, driving torque is decreased and load torque is increased.

In the present invention, when feedback correction is performed on the driving torque and the load torque of the engine of the electro-mechanical transmission system, the following formulas are used:

$$T_{ecom}' = k_T T_{ecom}; \text{ and}$$

$$T_{ef}' = k_{Tf} T_{ef}, \text{ where}$$

in the formulas, $k_T$ represents a correction coefficient of the driving torque of the engine of the electro-mechanical transmission system, and $k_{Tf}$ represents a correction coefficient of the load torque of the engine of the electro-mechanical transmission system.

Figure 4:
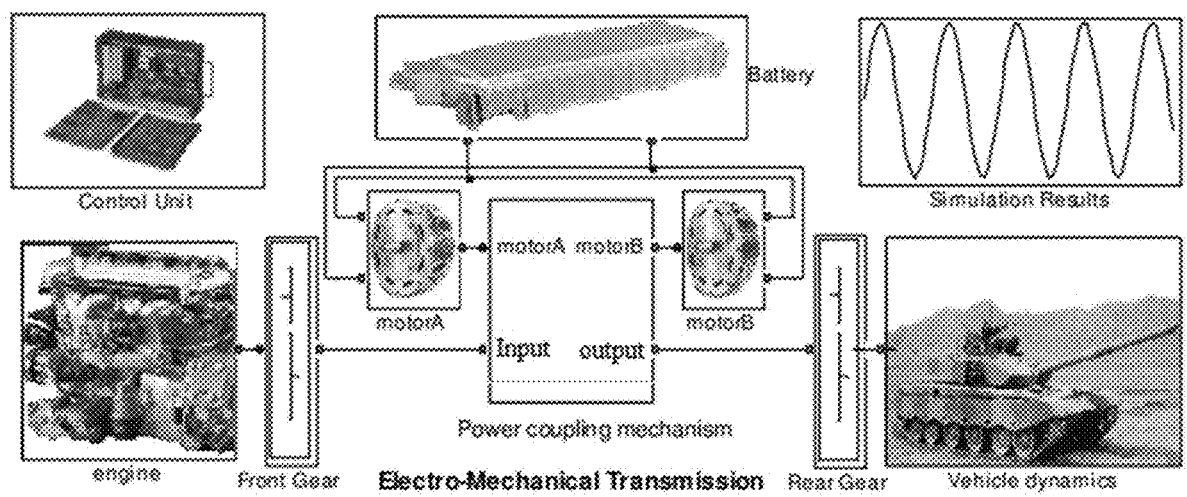
FIG. 4 is a schematic structural diagram of simulation in a real-time optimization control method for an electro-mechanical transmission system according to the present invention.

In the present invention, the real-time optimization control may be implemented based on an MATLAB2011b simulation platform. As shown in FIG. 4, a simulation model of the electro-mechanical transmission system is set up based on the MATLAB2011b simulation platform, and then the electro-mechanical transmission system is controlled by using the method, to control the electro-mechanical transmission system.

It apparent for those skilled in the art that the present invention is not limited to the details of the above exemplary examples, and that the present invention may be implemented in other specific forms without departing from the spirit or basic features of the present invention. The examples should be regarded as exemplary and non-limiting in every respect, and the scope of the present invention is defined by the appended claims rather than the above description. Therefore, all changes falling within the mean-

What is claimed is:

1. A real-time optimization control method for an electro-mechanical transmission system performed by a controller, the real-time optimization control method comprising:
(S0) starting;
(S1) state observation: a current operating state of each element of the electro-mechanical transmission system is obtained through state observation;
(S2) dynamic prediction: a feasible operating range of each element of the electro-mechanical transmission system is obtained through dynamic prediction;
(S3) optimal decision: an optimal control command of each element in the optimal decision is formulated and executed;
(S4) feedback correction: feedback correction is performed on a motor and an engine of the electro-mechanical transmission system by using state deviations; and
(S5) determining whether feedback correction meets a requirement, and if feedback correction meets the requirement, ending the process, or if feedback correction does not meet the requirement, repeating (S1)-(S5).

2. The real-time optimization control method according to claim 1, wherein S1 is specifically as follows:
output torque of the electro-mechanical transmission system is calculated and observed by using a torque estimation method, and because a dynamic response time of the motor of the electro-mechanical transmission system is far less than a dynamic response time of the engine, it is considered that actual torque of the motor is equal to target torque thereof, and is represented by using the following formula:

$$T_{eact} = J_e \frac{d\omega_e}{dt} + \frac{e_1 T_A + e_2 T_B}{i_q \eta_q},$$

wherein
$T_{eact}$ represents the actual torque, $J_e$ is an equivalent moment of inertia of an output end of the engine, in the unit of kg·m$^2$, $\omega_e$ is an angular velocity of the engine, in the unit of rad/s, $\eta_q$ is transmission efficiency, $i_q$ is a transmission ratio of the engine to an input end of a power coupling mechanism, $T_A$ and $T_B$ are input torque and output torque of the coupling mechanism, and $e_1$ and $e_2$ are torque coefficient matrices in two modes.

3. The real-time optimization control method according to claim 2, wherein acceleration of the engine is obtained by performing Kalman filtering on a rotation speed of the engine.

4. The real-time optimization control method according to claim 2, wherein the electro-mechanical transmission system obtains a bus voltage by using a sensor, and then calculates a current and a state of charge (SOC) by using a battery pack model of the electro-mechanical transmission system, wherein formulas for calculating the current and the SOC of the battery pack are as follows:

$$I(t) = \frac{V_{oc} - \sqrt{V_{oc}^2 + 4P_b(t)R_b}}{7200 C_b R_b}; \text{ and}$$

$$SOC(t) = -\int_0^t I(t)dt + SOC_0,$$

wherein
in the foregoing formulas, I(t) represents a current, and a discharge is positive, in the unit of A; $V_{oc}$ represents an open circuit voltage, in the unit of V; $R_b$ represents an internal resistance of the battery pack, in the unit of Ω; $C_b$ represents a capacity of the battery pack, in the unit of Ah; and $SOC_0$ represents an initial SOC of the battery pack; and $P_b(t)$ represents a power of the battery pack.

5. The real-time optimization control method according to claim 1, wherein S2 is specifically as follows:
two different motors of the electro-mechanical transmission system work within their respective upper rotation speed limits, the engine of the electro-mechanical transmission system works in a particular rotation speed range, and the following formulas are met:

$$n_e = \frac{1}{a_1} n_A - \frac{a_2}{a_1} n_o; \text{ and}$$

$$n_e = \frac{1}{b_1} n_B - \frac{b_2}{b_1} n_o,$$

wherein
in an EVT1 mode, $a_1>0$, and $b_1=0$; $a_1$, $a_2$, $b_1$, $b_2$ represent speed coefficients; $n_o$ represents a rotation speed of an output shaft; therefore, a rotation speed of the engine $n_e$ monotonically increases with a rotation speed of a motor A $n_A$, and is uncorrelated with a rotation speed of a motor B $n_B$, and the rotation speed range of the engine may be obtained based on an upper rotation speed limit $n_{Amax}$ and a lower rotation speed limit $n_{Amin}$ of the motor A, and is as follows:

$$\frac{1}{a_1} n_{Amin} - \frac{a_2}{a_1} n_o < n_e < \frac{1}{a_1} n_{Amax} - \frac{a_2}{a_1} n_o;$$

in an EVT2 mode, $a_1<0$, and $b_1>0$; therefore, the rotation speed of the engine monotonically decreases with the rotation speed of the motor A, and monotonically increases with the rotation speed of the motor B, and the rotation speed range of the engine may be obtained based on the upper rotation speed limits and lower rotation speed limits of the two motors, and is as follows:

$$n_{emin} = \max\left(\frac{1}{a_1} n_{Amax} - \frac{a_2}{a_1} n_o, \frac{1}{b_1} n_{Bmin} - \frac{b_2}{b_1} n_o\right); \text{ and}$$

$$n_{emax} = \min\left(\frac{1}{a_1} n_{Amin} - \frac{a_2}{a_1} n_o, \frac{1}{b_1} n_{Bmax} - \frac{b_2}{b_1} n_o\right);$$

$n_{emin}$ and $n_{emax}$ represent a lower rotation speed limit and an upper rotation speed limit of the engine respectively a torque range of the engine not only depends on a current rotation speed, but also is correlated with a dynamic response characteristic thereof, the engine is approximate to a first-order system herein, and the torque range thereof is as follows:

$$T_{emax} = T_{eact} + [f_e(n_{eact}) - T_{eact}]e^{-\frac{\delta t}{T}}; \text{ and}$$

$$T_{emin} = T_{eact}\left(1 - e^{-\frac{\delta t}{T}}\right),$$

wherein
in the formulas, $T_{emax}$ represents a maximum torque of the engine, $T_{emin}$ represents a minimum torque of the engine, $n_{eact}$ represents an actual rotation speed of the engine: $f_e$ represents an external characteristic interpolation function of the engine; $\delta t$ represents a time step of dynamic prediction; and T represents a time constant of the engine.

6. The real-time optimization control method according to claim 5, wherein the EVT1 mode is a state in which a brake of the electro-mechanical transmission system is engaged and a clutch is disengaged; and the EVT2 mode is a state in which the brake of the electro-mechanical transmission system is disengaged and the clutch is engaged.

7. The real-time optimization control method according to claim 1, wherein S3 is specifically as follows:
an optimal rotation speed and target torque of the electro-mechanical transmission system are determined based on opening of an accelerator pedal of the electro-mechanical transmission system and by using an optimal working curve of the engine of the electro-mechanical transmission system; then, load torque of the electro-mechanical transmission system is determined based on a speed adjustment time requirement of the engine of the electro-mechanical transmission system, to impose torque restriction on multi-target optimization of the electro-mechanical transmission system; finally, performance indexes of the system are classified into multiple layers based on a priority of an energy management policy of the electro-mechanical transmission system, and an analytic method is used at each layer to obtain optimal torque of the two motors, wherein speed adjustment needs to be performed on the engine of the electro-mechanical transmission system before mode switching of the electro-mechanical transmission system, to ensure that a speed difference of the clutch or the brake of the electro-mechanical transmission system is less than a threshold; in this case, a target rotation speed of the engine of the electro-mechanical transmission system is no longer determined by the opening of the accelerator pedal, but depends on a current vehicle speed of the electro-mechanical transmission system instead, and a mathematical expression of the target rotation speed of the engine is:

$$n_{ecom} = \frac{(1 + k_2 + k_3)i_q i_h}{0.377(1 + k_2)r_z}v,$$

wherein
in the formula, $n_{ecom}$ represents the target rotation speed of the engine before mode switching of the electro-mechanical transmission system; $k_2$ and $k_3$ respectively represent characteristic parameters of a second and third planetary gear mechanisms; $i_q$ represents a front transmission ratio, $i_h$ represents a rear transmission ratio; $r_z$ represents a radius of a driving wheel; and v represents the current vehicle speed.

8. The real-time optimization control method according to claim 1, wherein S4 is specifically as follows:
if a speed difference between a target rotation speed and an actual rotation speed of the engine of the electro-mechanical transmission system exceeds a threshold, a torque value of the electro-mechanical transmission system is corrected; when the speed difference of the engine of the electro-mechanical transmission system is within a range of ±50 rpm, the torque does not need to be corrected; and when the speed difference is greater than zero, driving torque is increased and load torque is decreased; or when the speed difference is less than zero, driving torque is decreased and load torque is increased.

9. The real-time optimization control method for an electro-mechanical transmission system according to claim 8, wherein when feedback correction is performed on the driving torque and the load torque of the engine of the electro-mechanical transmission system, the following formulas are used:

$$T_{ecom}' = k_T T_{ecom}; \text{ and}$$

$$T_{ef}' = k_{Tf} T_{ef} \text{ where}$$

in the formulas, $k_T$ represents a correction coefficient of the driving torque of the engine of the electro-mechanical transmission system, and $k_{Tf}$ represents a correction coefficient of the load torque of the engine of the electro-mechanical transmission system; $T_{ecom}$ represents a target torque value of the engine; $T_{ecom}'$ represents a corrected target torque value of the engine; $T_{ef}$ represents a load torque value of the engine; and $T_{ef}'$ represents a corrected load torque value of the engine.

* * * * *

UNITED STATES PATENT AND TRADEMARK OFFICE
CERTIFICATE OF CORRECTION

| | | |
|---|---|---|
| PATENT NO. | : 10,940,849 B1 | Page 1 of 2 |
| APPLICATION NO. | : 16/896461 | |
| DATED | : March 9, 2021 | |
| INVENTOR(S) | : Wang et al. | |

It is certified that error appears in the above-identified patent and that said Letters Patent is hereby corrected as shown below:

In the Specification

In Column 2, Lines 36-38 delete "" $$T_{eact} = J_e \frac{d\omega_2}{dt} + \frac{e_2 T_A + e_2 T_B}{i_q \eta_q}$$ "" and replace with -- $$T_{eact} = J_e \frac{d\omega_e}{dt} + \frac{e_1 T_A + e_2 T_B}{i_q \eta_q}$$ --

In Column 2, Lines 58-63 delete ""$$I(t) = \frac{V_{oc} - \sqrt{V_{or}^2 + 4P_b(t)R_b}}{7200 C_b R_b}$$"", "" $$SOC(t) = -\int_0^t I(t)dt + SOC_0$$ ""

and replace with -- $$I(t) = \frac{V_{oc} - \sqrt{V_{oc}^2 + 4P_b(t)R_b}}{7200 C_b R_b}$$ --

-- $$SOC(t) = -\int_0^t I(t)dt + SOC_0$$ --

In Column 3, Line 59 delete ""$\delta St$"" and replace with --$\delta t$--

In Column 4, Line 55-58 delete ""$T_{ecom}' = k_T T_{ecom}$; and""
""$T_{ef}' - k_{Tf} T_{ef}$ ,where"" and replace with Signed and Sealed this
Twenty-third Day of November, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,940,849 B1

-- $T'_{ecom} = k_T T_{ecom}$ ;and $T'_{ef} = k_{Tf} T_{ef}$ ,where--

In Column 8, Line 42-45 delete ""$T_{ecom}' = k_T T_{ecom}$; and"" ""$T_{ef}' - k_{Tf} T_{ef}$ ,where"" and replace with -- $T'_{ecom} = k_T T_{ecom}$ ;and $T'_{ef} = k_{Tf} T_{ef}$ ,where--

In the Claims

In Column 12, Claim 8 Line 38-42 delete ""$T_{ecom}' = k_T T_{ecom}$; and"" ""$T_{ef}' - k_{Tf} T_{ef}$ ,where"" and replace with -- $T'_{ecom} = k_T T_{ecom}$ ;and $T'_{ef} = k_{Tf} T_{ef}$ ,where--